(12) United States Patent
Huang et al.

(10) Patent No.: US 12,324,198 B2
(45) Date of Patent: Jun. 3, 2025

(54) SEMICONDUCTOR DEVICE AND MANUFACTURE METHOD THEREOF (71) Applicant: YANGTZE MEMORY TECHNOLOGIES CO., LTD., Wuhan (CN)

(72) Inventors: Teng Huang, Wuhan (CN); Ziqun Hua, Wuhan (CN); Yanwei Shi, Wuhan (CN); Lan Yao, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 244 days.

(21) Appl. No.: 17/702,008

(22) Filed: Mar. 23, 2022

(65) Prior Publication Data
US 2023/0064099 A1 Mar. 2, 2023

Related U.S. Application Data (63) Continuation of application No. PCT/CN2021/115748, filed on Aug. 31, 2021.

(51) Int. Cl.
H01L 29/06 (2006.01)
H01L 21/762 (2006.01)
H10D 62/10 (2025.01)

(52) U.S. Cl.
CPC ..... *H10D 62/115* (2025.01); *H01L 21/76224* (2013.01)

(58) Field of Classification Search
CPC ........... H01L 29/0649; H01L 21/76224; H01L 29/42336; H01L 29/41766; H01L 29/7858
See application file for complete search history.

(56) References Cited

U.S. PATENT DOCUMENTS

| 2009/0072355 | A1 | 3/2009 | Cheng et al. | |
| 2009/0108374 | A1* | 4/2009 | Wong | H10B 10/12 257/E27.098 |
| 2019/0035929 | A1* | 1/2019 | Syue | H01L 29/1037 |
| 2019/0123198 | A1* | 4/2019 | Pan | H01L 29/6659 |
| 2021/0134678 | A1* | 5/2021 | Chen | H01L 27/0924 |
| 2022/0399447 | A1* | 12/2022 | Akaiwa | H01L 27/0629 |

FOREIGN PATENT DOCUMENTS

| CN | 103066008 A | 4/2013 |
| CN | 104517892 A | 4/2015 |
| CN | 110660802 A | 1/2020 |
| CN | 112802796 A | 5/2021 |
| CN | 112864156 A | 5/2021 |

* cited by examiner

Primary Examiner — Fernando L Toledo
Assistant Examiner — Neil R Prasad
(74) Attorney, Agent, or Firm — BAYES PLLC (57) ABSTRACT A semiconductor device and a method of fabricating the semiconductor device are provided. The method includes: forming a first bottom isolation layer and a second bottom isolation layer in a substrate, the thickness of the second bottom isolation layer being less than that of the first bottom isolation layer; and forming, on the a first active area in the substrate, a first gate structure extending to the first bottom isolation layer and forming, on a second active area in the substrate, a second gate structure extending to the second bottom isolation layer.

20 Claims, 9 Drawing Sheets

Forming a first shallow trench isolation trench and a second shallow trench isolation trench in a substrate having a first active area and a second active area disposed separately from each other, where the first shallow trench isolation trench may be on a periphery of the first active area, the second shallow trench isolation trench may be on a periphery of the second active area, the first active area may include a first source region and a first drain region disposed separately from each other, and the second active area may include a second source region and a second drain region disposed separately from each other — 101

Forming a first bottom isolation layer in the first shallow trench isolation trench and forming a second bottom isolation layer in the second shallow trench isolation trench, where the thickness of the second bottom isolation layer may be less than that of the first bottom isolation layer — 102

Forming a first gate structure and a second gate structure, where the first gate structure may be on a portion of the first active area between the first source region and the first drain region and extend along two opposite sidewalls of the first active area onto the first bottom isolation layer, and the second gate structure may be on a portion of the second active area between the second source region and the second drain region and extend along two opposite sidewalls of the second active area onto the second bottom isolation layer — 103

SEMICONDUCTOR DEVICE AND MANUFACTURE METHOD THEREOF

CROSS-REFERENCES TO RELATED APPLICATIONS

This application is a continuation of International Application No. PCT/CN2021/115748, entitled "Semiconductor Device and Manufacture Method Thereof," filed on Aug. 31, 2021, which is incorporated herein by reference in its entirety.

BACKGROUND

The present disclosure relates to the field of semiconductor technologies, and more particularly to a semiconductor device and a method of fabricating the same.

In a semiconductor device, in order to reduce the footprint, transistors in the peripheral structure (e.g., complementary metal-oxide semiconductor, i.e., CMOS) could be improved. In the manufacturing processes of other approaches for improving such a transistor, a shallow trench isolation structure is fabricated on an active area, and a gate is formed on the active area.

However, in semiconductor devices, there are different types of transistors with different junction depths, but only the transistors with the same junction depth can be obtained with the other approaches. It, therefore, limits further scaling down the footprint of the semiconductor device.

SUMMARY

The disclosure provides a semiconductor device and a method of fabricating the same, which can result in transistors with different junction depths and reduce footprint of the semiconductor device.

The disclosure provides a method of fabricating a semiconductor device, including:
  forming a first shallow trench isolation trench and a second shallow trench isolation trench in a substrate having a first active area and a second active area disposed separately from each other, wherein the first shallow trench isolation trench is on a periphery of the first active area, the second shallow trench isolation trench is on a periphery of the second active area, the first active area includes a first source region and a first drain region disposed separately from each other, and the second active area includes a second source region and a second drain region disposed separately from each other;
  forming a first bottom isolation layer in the first shallow trench isolation trench and a second bottom isolation layer in the second shallow trench isolation trench, wherein the thickness of the second bottom isolation layer is less than that of the first bottom isolation layer; and
  forming a first gate structure and a second gate structure, wherein the first gate structure is on a portion of the first active area between the first source region and the first drain region and extends along two opposite sidewalls of the first active area onto the first bottom isolation layer, and the second gate structure is on a portion of the second active area between the second source region and the second drain region and extends along two opposite sidewalls of the second active area onto the second bottom isolation layer.

In some implementations, the size of the opening of the second shallow trench isolation trench is larger than that of the first shallow trench isolation trench.

The step of forming the first bottom isolation layer in the first shallow trench isolation trench and forming the second bottom isolation layer in the second shallow trench isolation trench includes:
  spin-coating isolating material onto the bottom of first shallow trench isolation trench and onto the bottom of the second shallow trench isolation trench, such that the isolating material in the first shallow trench isolation trench forms the first bottom isolation layer, and the isolating material in the second shallow trench isolation trench forms the second bottom isolation layer.

In some implementations, the step of forming the first bottom isolation layer in the first shallow trench isolation trench and forming the second bottom isolation layer in the second shallow trench isolation trench includes:
  filling the first shallow trench isolation trench with a first dielectric layer;
  filling the second shallow trench isolation trench with a second dielectric layer; and
  etching the first dielectric layer and the second dielectric layer respectively, such that the second dielectric layer is etched to a larger depth than the first dielectric layer, the etched first dielectric layer forms the first bottom isolation layer, and the etched second dielectric layer forms the second bottom isolation layer.

In some implementations, the etching rate of the first dielectric layer is slower than that of the second dielectric layer.

In some implementations, the step of filling the first shallow trench isolation trench with the first dielectric layer includes:
  forming, on the substrate, a first masking layer having a first hollow structure therein corresponding to the position of the first shallow trench isolation trench;
  filling the first shallow trench isolation trench with the first dielectric layer through the first hollow structure; and
  removing the first masking layer.

In some implementations, the step of filling the second shallow trench isolation trench with the second dielectric layer includes:
  forming, on the substrate and the first dielectric layer, a second masking layer having a second hollow structure therein corresponding to the position of the second shallow trench isolation trench;
  filling the second shallow trench isolation trench with the second dielectric layer through the second hollow structure; and
  removing the second masking layer.

More preferably, the step of forming the first and second gate structures includes:
  forming a gate insulating layer on an inner surface of the first shallow trench isolation trench, an inner surface of the second shallow trench isolation trench and the substrate;
  forming a gate layer on the gate insulating layer;
  etching the gate insulating layer and the gate layer, such that the gate insulating layer and the gate layer being etched form the first and second gate structures.

In some implementations, after the step of forming the first and second gate structures, the method also includes:
  filling the first and second shallow trench isolation trenches with an insulating layer, such that the insulating layer in the first shallow trench isolation trench and the first bottom isolation layer form a first shallow trench isolation structure, and the insulating layer in the second shallow trench isolation trench and the second bottom isolation layer form a second shallow trench isolation structure.

In some implementations, the first active area is a low-voltage active area and the second active area is a high-voltage active area.

The disclosure also provides a semiconductor device, including:
a substrate having a first active area and a second active area disposed separately from each other, wherein the first active area includes a first source region and a first drain region disposed separately from each other, and the second active area includes a second source region and a second drain region disposed separately from each other;
a first bottom isolation layer on a periphery of the first active area and a second bottom isolation layer on a periphery of the second active area, wherein the thickness of the second bottom isolation layer is less than that of the first bottom isolation layer; and
a first gate structure and a second gate structure, wherein the first gate structure is on a portion of the first active area between the first source region and the first drain region and extends along two opposite sidewalls of the first active area onto the first bottom isolation layer, and the second gate structure is on a portion of the second active area between the second source region and the second drain region and extends along two opposite sidewalls of the second active area onto the second bottom isolation layer.

In some implementations, the cross-sectional area of the second bottom isolation layer is larger than that of the first bottom isolation layer.

In some implementations, the etching rate of the first bottom isolation layer is slower than that of the second bottom isolation layer.

In some implementations, each of the first gate structure and the second gate structure includes a gate insulating layer on the active area and a gate layer on the gate insulating layer.

In some implementations, the semiconductor device also includes:
an insulating layer on the first bottom isolation layer and the second bottom isolation layer, the first bottom isolation layer and the corresponding insulating layer forming the first shallow trench isolation structure, and the second bottom isolation layer and the corresponding insulating layer forming the second shallow trench isolation structure.

In some implementations, the first active area is a low-voltage active area and the second active area is a high-voltage active area.

As beneficial effects of the disclosure, by firstly forming first and second shallow trench isolation trenches in a substrate, forming a first bottom isolation layer in the first shallow trench isolation trench and forming a second bottom isolation layer in a second shallow trench isolation trench with the height of the second bottom isolation layer being less than that of the first bottom isolation layer, and then forming first and second gate structures, such that the first gate structure is on the first active area and extends along two opposite sidewalls of the first active area to the first bottom isolation layer, the second gate structure is on the second active area and extends along two opposite sidewalls of the second active area to the second bottom isolation layer, and the extending distances of the first and second gate structures along the sidewalls of their corresponding active areas are different from each other, thus transistors with different junction depths can be obtained and the footprint of the semiconductor device can be reduced.

BRIEF DESCRIPTION OF THE DRAWINGS

In order to illustrate technical solutions in embodiments of the present disclosure, drawings needed for the description of the embodiments will be briefly introduced. Apparently, drawings in the following description represent only some embodiments of the present disclosure and, based on the embodiments, other drawings that can be figured out by those of ordinary skills in the art without any creative works also fall into the scope of the present disclosure.

DETAILED DESCRIPTION

Specific details of structures, functions, configurations, and arrangements disclosed herein may be given only as examples and used for the purpose of describing some embodiments of the present disclosure. However, the present disclosure may be implemented, realized, or applied in many alternative forms without being limited to the embodiments described herein.

In the description of the present disclosure, it is understood that orientation and position relationships indicated by the terms "center," "lateral direction," "upper," "lower," "left," "right," "vertical," "horizontal," "top," "bottom," "inner," and "outer" may be those based on the drawings and only for the simplicity of the description of the present disclosure. There is no indication or implication that the devices or elements referred to must have any particular orientations and positions or be constructed or operated in any particular orientations and positions. As a result, these terms should not be understood as a limitation for the present disclosure. Moreover, the terms "first," "second," etc. may be only used for the simplicity of description and should not be understood to indicate or imply relative importance or designate implicitly the number of the features referred to. Therefore, the feature defined by "first" or "second" may include explicitly or implicitly one or more instances of that feature. In the description of the present disclosure, the meaning of "a plurality of" may be two or more, unless otherwise specified. Moreover, the terms "include", "comprise," and variations thereof may be intended to cover the meaning of "include or comprise non-exclusively."

In the description of the present disclosure, it is to be noted that the terms "mount," "join," and "connect" should be explained broadly. They may include, for example, fixed connection, removable connection, or integral connection;

mechanical connection or electrical connection; direct join or join with intermediate medium; or inner communication of two elements, unless otherwise specified or limited expressly. For those of ordinary skill in the art, the specific meaning of the above-mentioned terms in the present disclosure should be understood depending on specific circumstances.

The terms used herein are only for the purpose of describing specific embodiments without any intention of limiting them. Singular forms such as "a," "an," and "the," may be also intended to include plural forms, unless otherwise noted in the context. It is also understood that the terms "include" and/or "comprise" used herein designate the existence of the stated features, integers, steps operations, elements, and/or assemblies without excluding the existence or addition of one or more other features, integers, steps, operations, elements, assemblies and/or any combination thereof.

Figure 1:
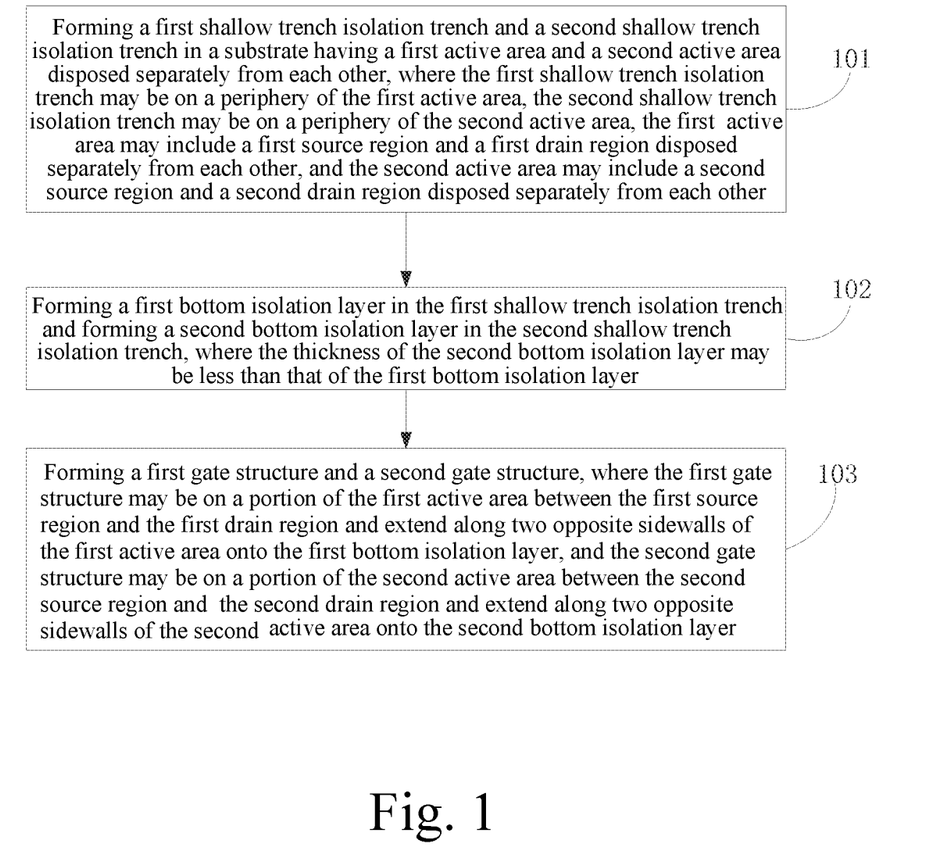
FIG. 1 is a flowchart illustrating an exemplary method of fabricating a semiconductor device, according to some embodiments of the present disclosure.

FIG. 1 is a flowchart illustrating a method of fabricating a semiconductor device, according to some embodiments of the present disclosure, whereas FIGS. 2a-20 are structural diagrams illustrating an exemplary method of fabricating the semiconductor device, according to some embodiments of the present disclosure.

Figure 2A:
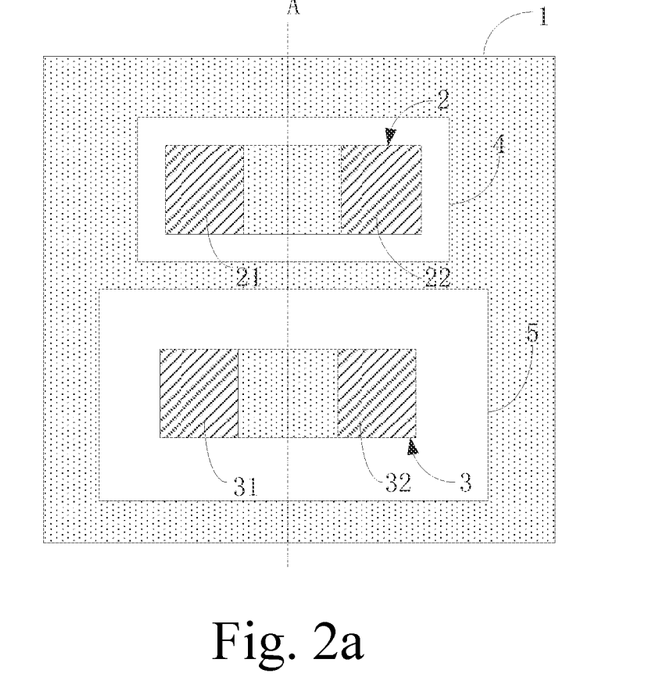
FIGS. 2a-2o are structural diagrams illustrating an exemplary method of fabricating a semiconductor device, according to some embodiments of the present disclosure.

At 101 in FIG. 1, a first shallow trench isolation trench 4 and a second shallow trench isolation trench 5 may be formed in a substrate 1 having a first active area 2 and a second active area 3 disposed separately from each other, as shown in FIG. 2a. The first shallow trench isolation trench 4 may be arranged on a periphery of the first active area 2. The second shallow trench isolation trench 5 may be arranged on a periphery of the second active area 3. The first active area 2 may include a first source region 21 and a first drain region 22 disposed separately from each other. The second active area 3 may include a second source region 31 and a second drain region 32 disposed separately from each other.

In some embodiments of the present disclosure, the substrate 1 may be first provided. The substrate 1 may be a silicon substrate, a germanium substrate, or a substrate of any other components. In some instances, the substrate 1 may be doped with, e.g., a tiny amount of, elements of group III, such as boron, indium, gallium, aluminum, or the like, to form a P type of semiconductor substrate. In some instances, the substrate 1 may be doped with, e.g., a tiny amount of, elements of group VI, such as phosphorous, antimony, arsenic, or the like, to form an N type of semiconductor substrate. The substrate 1 may have the active areas 2, 3 formed on a surface of the substrate 1. Through ion implantation (IMP), dopants of P type or N type may be implanted into the active areas, which form P type or N type active areas of the substrate 1.

Afterward, through ion implantation, particular regions of the active areas 2, 3 in the substrate 1 may be doped to form the source and drain regions in the active areas 2, 3. The source and drain regions may be on the surface of the substrate 1 and disposed separately. The source and drain regions may form a P-type doped region or an N-type doped region through P-type or N-type dopant implantation. In some instances, the source region and drain region may have the same doping type. If an N-type transistor is needed, the source and drain regions may be implanted with an N-type dopant, and if a P-type transistor is needed, the source and drain regions may be implanted with an P-type dopant.

Through ion implantation, particular regions of an active area 2, 3 in the substrate 1 may also be doped to form a first doped region and a second doped region in the active area of the substrate. The first and second doped regions may be near the upper surface of the substrate 1. The first doped region and the second doped region may be disposed separately from each other, with the first doped region being on the side of the source region facing away from the drain region and the second doped region being on the side of the drain region facing away from the source region. Each of the first and second doped regions may form a P-type doped region or an N-type doped region through P-type or N-type dopant implantation. The first and second doped regions may have the same doping type. The first and second doped regions may be configured to pad out the active area 2, 3, so that external bias voltages may be applied to the active area 2, 3 to provide a transistor with different base bias voltages.

The substrate 1 may be provided and may include a plurality of separately disposed active areas therein and each active area may correspond to one transistor. For example, the substrate 1 may include, separately disposed, the first active area 2 and the second active area 3, as shown in FIG. 2a. In some instances, the first active area 2 may be a low-voltage active area and the second active area 3 may be a high-voltage active area. A low-voltage active area may be used to indicate that the transistor corresponding to an active area has a relatively low operating voltage, while a high-voltage active area may be used to indicate that the transistor corresponding to an active area has a relatively high operating voltage. In other words, the transistor corresponding to the active area has a relatively high operating voltage may be a high-voltage transistor, whereas the transistor corresponding to the active area has a relatively low operating voltage may be a low-voltage transistor. The terms "high-voltage" and "low-voltage" are relative concepts, and a high-voltage transistor may operate at a voltage higher than a low-voltage transistor.

The first active area 2 may include, separately disposed, the first source region 21 and the first drain region 22, and the second active area 3 may include, separately disposed, the second source region 31 and the second drain region 32.

Figure 2B:
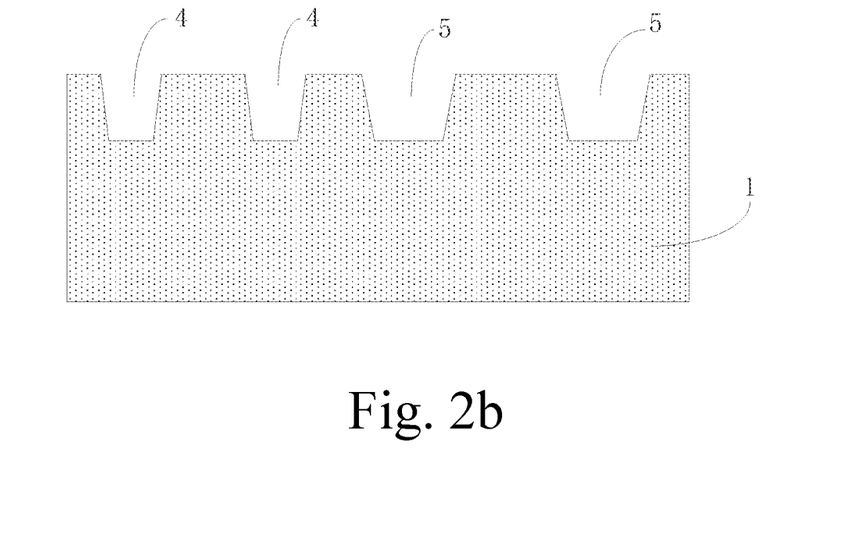

The first shallow trench isolation trench 4 may be formed on a periphery of the first active area 2 in the substrate 1, and a second shallow trench isolation trench 5 may be formed on a periphery of the second active area 3 in the substrate 1. In some embodiments, the first shallow trench isolation trench 4 may surround the first active area 2, and the second shallow trench isolation trench 5 may surround the second active area 3. As shown in FIG. 2b, which is a cross-sectional view taking along a dashed line A in FIG. 2a. The sectional line A may be a line perpendicular to a boundary line of the first shallow trench isolation trench 4 or the second shallow trench isolation trench 5. In some embodiments, the first shallow trench isolation trench 4 may include the same depth as the second shallow trench isolation trench 5. In some embodiments, the second shallow trench isolation trench 5 may include a size of opening larger than that of the first shallow trench isolation trench 4. For instance, a cross-sectional area of the second shallow trench isolation trench 5 may be larger than that of the first shallow trench isolation trench 4 in view of the sectional view taken by line A.

Figure 2C:
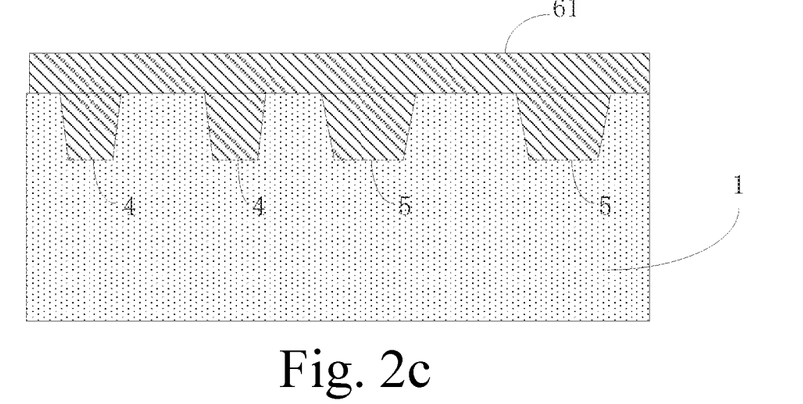
Figure 2D:
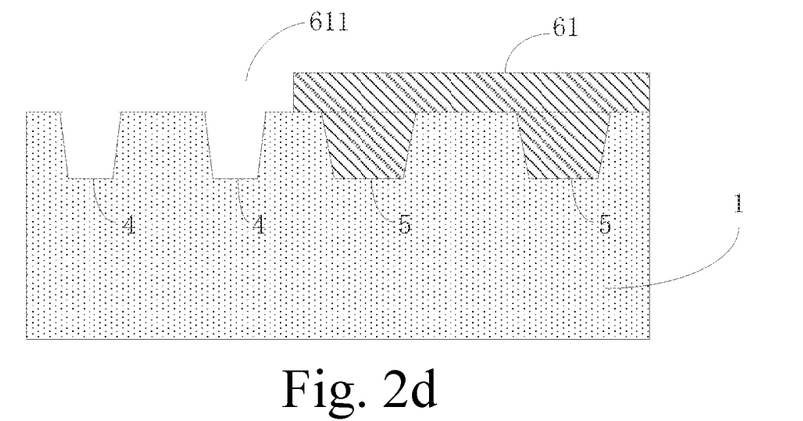
Figure 2E:
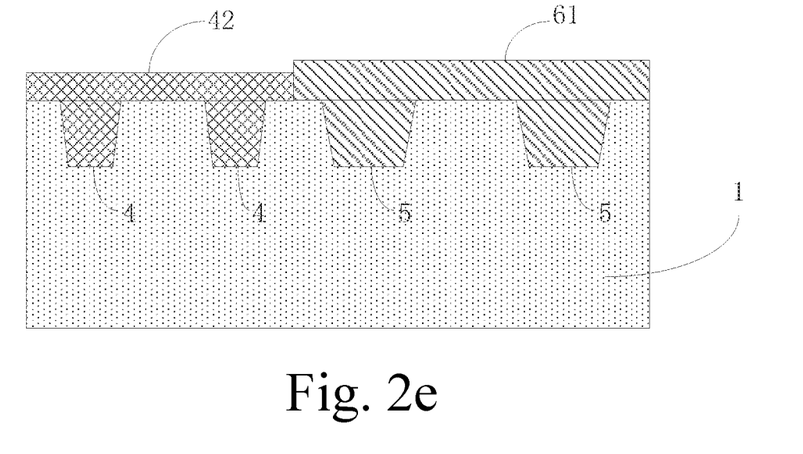
Figure 2F:
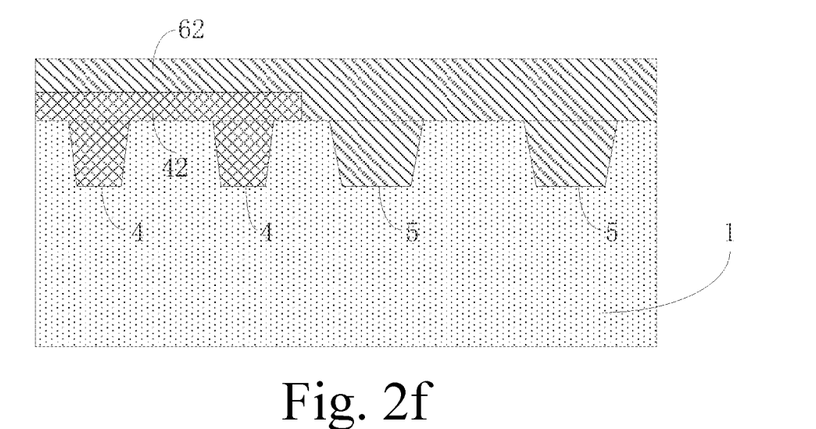
Figure 2G:
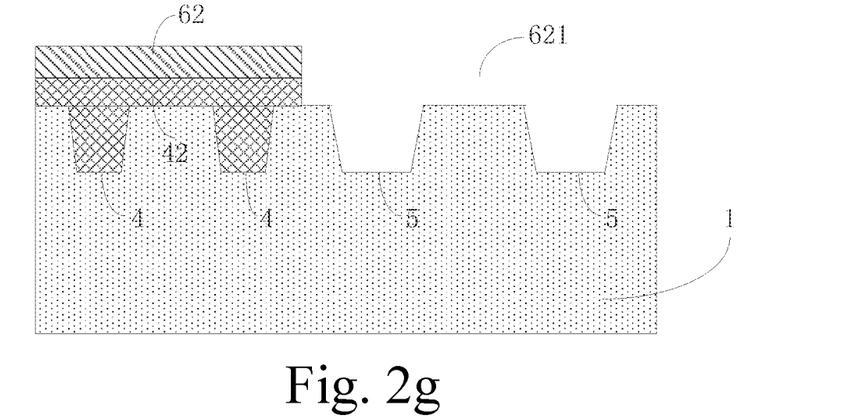
Figure 2H:
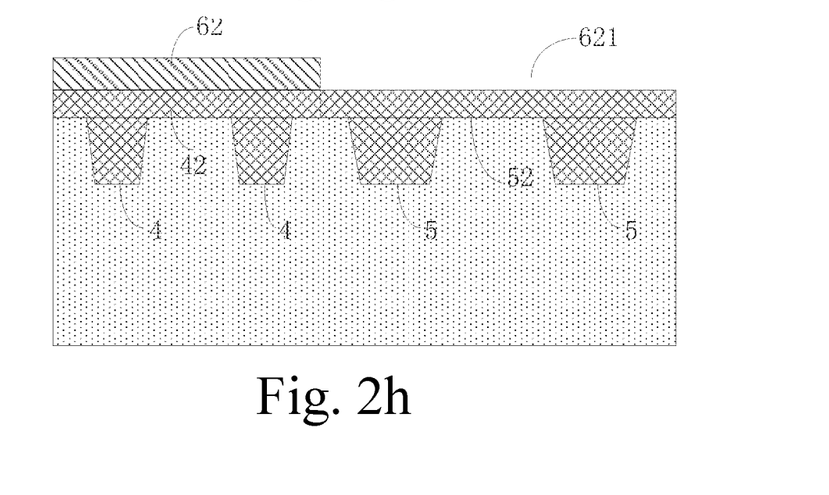
Figure 2I:
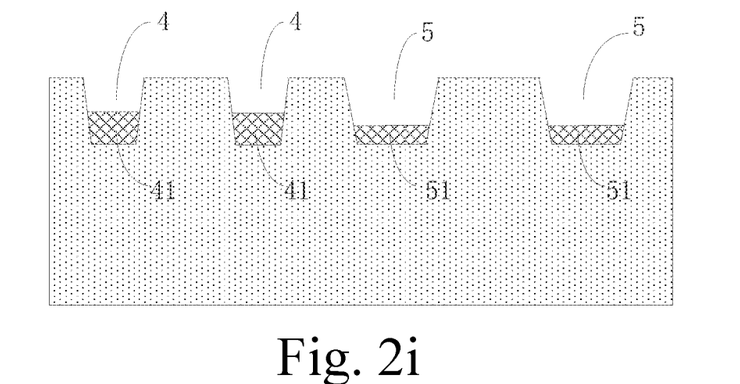

At step 102 in the method shown in FIG. 1 with reference to FIG. 2i, a first bottom isolation layer 41 may be formed in the first shallow trench isolation trench 4, and a second bottom isolation layer 51 may be formed in the second shallow trench isolation trench 5. In some embodiments, the thickness of the second bottom isolation layer 51 may be less than that of the first bottom isolation layer 41, as shown in FIG. 2i.

In accordance with the scope of the present disclosure, in order to ensure the subsequent formation of the transistors having different junction depths, the depth of the first shallow trench isolation trench 4 may be the same as that of the second shallow trench isolation trench 5. Further, the thickness of the first bottom isolation layer 41 may be less than the depth of the first shallow trench isolation trench 4, the thickness of the second bottom isolation layer 51 may be less than the depth of the second shallow trench isolation trench 5, and the thickness of the second bottom isolation layer 51 may be less than that of the first bottom isolation layer 41, as shown in FIG. 2*i*.

In accordance with the scope of the present disclosure, step 102, for forming the first bottom isolation layer 41 in the first shallow trench isolation trench 4 and forming the second bottom isolation layer 51 in the second shallow trench isolation trench 5, may include the following process(es):

In some embodiments, the first shallow trench isolation trench 4 may be filled with a first dielectric layer, and the second shallow trench isolation trench 5 may be filled with a second dielectric layer. The first dielectric layer and the second dielectric layer may be etched respectively, such that the second dielectric layer may be etched to a larger depth than the first dielectric layer. Subsequently, the etched first dielectric layer may form the first bottom isolation layer 41, and the etched second dielectric layer may form the second bottom isolation layer 51 with less thickness.

The first and second shallow trench isolation trenches 4, 5 may be filled with dielectric layers of different qualities with different processes. In some embodiments, the dielectric layers of different qualities may have different etching rates, so as to obtain the dielectric layers with different etching depths when the dielectric layers in the first and second shallow trench isolation trenches 4, 5 are etched simultaneously. For example, the first shallow trench isolation trench 4 may be filled with a first dielectric layer of a higher quality and a slower etching rate, and the second shallow trench isolation trench 5 may be filled with a second dielectric layer of lower quality and a faster etching rate. When the first and second dielectric layers are etched, e.g., simultaneously, the first dielectric layer may be etched slower and to a less depth, and the second dielectric layer may be etched faster and to a larger depth. That is, after the etching, the remaining second dielectric layer may have a thickness less than the thickness of the remaining first dielectric layer. The remaining first dielectric layer may form the first bottom isolation layer 41, and the remaining second dielectric layer may form the second bottom isolation layer 51. In one instance, the thickness of the second bottom isolation layer 51 may be less than the thickness of the first bottom isolation layer 41. In some instances, the first and second dielectric layers may have the same material, such as a layer of oxide or the like.

The step of filling the first shallow trench isolation trench with the first dielectric layer may include the following process(es):

In some embodiments, a first masking layer may be formed, on the substrate, with a first hollow structure therein corresponding to the position of the first shallow trench isolation trench. The first shallow trench isolation trench may be filled with a first dielectric layer through the first hollow structure. The first masking layer may be removed.

The step of filling the second shallow trench isolation trench with the second dielectric layer may include the following process(es):

In some embodiments, a second masking layer may be formed, on the substrate, with a second hollow structure therein corresponding to the position of the second shallow trench isolation trench. The second shallow trench isolation trench may be filled with the second dielectric layer through the second hollow structure. The second masking layer may be removed.

As shown in FIG. 2*c*, a first masking layer 61 may be first formed on the substrate 1 and filled into the first shallow trench isolation trench 4 and the second shallow trench isolation trench 5. The first masking layer 61 may be a photoresist. As shown in FIG. 2*d*, a first hollow structure 611 may be formed in the first masking layer 61 through a first mask (not shown in the figure). In some embodiments, based on actual demands, the first mask may be designed with a first pattern that may be configured to form the first hollow structure 611 in the first masking layer 61 with the first hollow structure 611 corresponding to the position of the first shallow trench isolation trench 4. In some instances, the first shallow trench isolation trench 4 may be exposed through the first hollow structure 611. Subsequently, as shown in FIG. 2*e*, the first shallow trench isolation trench 4 may be filled with the first dielectric layer 42 using, e.g., an HDP (high-density plasma) process.

After filling of the first dielectric layer 42, as shown in FIG. 2*f*, the first masking layer 61 may be removed. A second masking layer 62 may be formed on the substrate 1 and the first dielectric layer 42. The second masking layer 62 may be photoresist and may fill the second shallow trench isolation trench 5. In some instances, the second masking layer 62 may be also formed on the first dielectric layer 42. As shown in FIG. 2*g*, a second hollow structure 621 may be formed in the second masking layer 62 through a second mask (not shown in the figure). In some embodiments, based on actual demands, the second mask may be designed with a second pattern that is configured to form the second hollow structure 621 in the second masking layer 62 with the second hollow structure 621 corresponding to the position of the second shallow trench isolation trench 5. In some instances, the second shallow trench isolation trench 5 may be exposed through the second hollow structure 621. Subsequently, as shown in FIG. 2*h*, the second shallow trench isolation trench 5 may be filled with the second dielectric layer 52 using, e.g., a TEOS (tetraethyl orthosilicate) process. The first dielectric layer 42 and the second dielectric layer 52 may be filled using different processes, i.e. an HDP process and a TEOS process respectively, so that, after the filling, the etching rate of the first dielectric layer 42 may be slower than that of the second dielectric layer 52. In some embodiments, the first dielectric layer 42 and the second dielectric layer 52 may have the same material, such as silicon oxide or the like.

Further, as shown in FIG. 2*i*, the second masking layer 62 may be removed. In some embodiments, the first dielectric layer 42 and the second dielectric layer 52 may be etched, e.g., simultaneously. As the first dielectric layer 42 may be etched slower than the second dielectric layer 52, the etched second dielectric layer 52 may include a thickness less than that of the etched first dielectric layer 42, i.e. the thickness of the second bottom isolation layer 51 may be less than that of the first bottom isolation layer 41. In some embodiments, after the filling of the second dielectric layer 52, the second masking layer 62 may not be removed and will be etched directly at the same time as the second dielectric layer 52. After the second masking layer 62 has been completely etched off, etching of the first dielectric layer 42 may be continued. Since the second masking layer 62 may be on the first dielectric layer 42 and thus the second masking layer 62 should be etched off first before etching the first dielectric layer 42, the thickness of the etched second dielectric layer 52 may be more than that of the etched first dielectric layer 42, i.e. the thickness of the second bottom isolation layer 51 may be less than that of the first bottom isolation layer 41.

In other embodiments, step 102 in FIG. 1, for forming the first bottom isolation layer in the first shallow trench isolation trench and forming the second bottom isolation layer in the second shallow trench isolation trench, may include the following process(es):

An isolating material may be spin-coated onto the bottom of the first shallow trench isolation trench and onto the bottom of the second shallow trench isolation trench, such that the isolating material in the first shallow trench isolation trench may form the first bottom isolation layer and the isolating material in the second shallow trench isolation trench may form the second bottom isolation layer.

As shown in FIG. 2i, a certain amount of an isolating material may be spin-coated into the bottom of the first shallow trench isolation trench 4 and the second shallow trench isolation trench 5, e.g., simultaneously using, e.g., a spin-coating process. The isolating material may be chosen as a material that may have good insulation, no electrical leakage, ease of filling, and ease of curing after spin-coating, e.g. SOD (Spin-on Dielectric). Since the size of the opening of the second shallow trench isolation trench 5 is larger than that of the first shallow trench isolation trench 4, the thickness of the isolating material spin-coated in the second shallow trench isolation trench 5 may be less than the thickness of the isolating material spin-coated in the first shallow trench isolation trench 4 when the same amount of isolating material is spin-coated onto the bottoms of the first shallow trench isolation trench 4 and the second shallow trench isolation trench 5. The isolating material spin-coated in the first shallow trench isolation trench 4 may form the first bottom isolation layer 41 and the isolating material spin-coated in the second shallow trench isolation trench 5 may form the second bottom isolation layer 51, such that the thickness of the second bottom isolation layer 51 may be less than that of the first bottom isolation layer 41, i.e. an upper surface of the second bottom isolation layer 51 may be below an upper surface of the first bottom isolation layer 41.

In some embodiments, the isolating material may be spin-coated, so that the better filling performance of the material can be obtained and the future demand of filling smaller shallow trench isolation trenches can be satisfied. Moreover, in accordance with the scope of the present disclosure, the bottom isolation layers may be formed without filling processes followed by etching processes. It, therefore, can simplify the process flow and reduce the process time and cost.

In step 103 of the method shown in FIG. 1, a first gate structure and a second gate structure may be formed. In some embodiments, the first gate structure may be on a portion of the first active area between the first source region and the first drain region and extend along two opposite sidewalls of the first active area onto the first bottom isolation layer. Further, the second gate structure may be on a portion of the second active area between the second source region and the second drain region and extend along two opposite sidewalls of the second active area onto the second bottom isolation layer.

In some embodiments, the first gate structure may be formed on a portion of the first active area between the first source region and the first drain region and extend along two opposite sidewalls of the first active area onto the first bottom isolation layer to form a first transistor in combination with the first source region and the first drain region in the first active area. The first transistor may be a low-voltage transistor. In some instances, the gate structure of the first transistor may be on the active area and extend along sidewalls of the active area in order to reduce the footprint of the first transistor and further reduce the footprint of the semiconductor device. In some embodiments, the second gate structure may be formed on a portion of the second active area between the second source region and the second drain region and extend along two opposite sidewalls of the second active area onto the second bottom isolation layer to form a second transistor in combination with the second source region and the second drain region in the second active area. The second transistor may be a high-voltage transistor. In some instances, the gate of the second transistor may be on the active area and extend along sidewalls of the active area in order to reduce the footprint of the second transistor and further reduce the footprint of the semiconductor device. In some embodiments, the first and second bottom isolation layers may have different thicknesses, and the depth to the first bottom isolation layer that the first gate structure extends along the sidewalls of the first active area may be different from the depth to the second bottom isolation layer that the second gate structure extends along the sidewalls of the second active area. That is, the first and second transistors may have different junction depths. Consequently, it becomes possible to obtain transistors with different junction depths while minimizing the footprint of the semiconductor device. The term "footprint" is used to indicate a layout arrangement of pads or through-holes for physically attaching and electrically connecting a component in a semiconductor device. The footprint may be related to the shrinking of semiconductor devices.

Specifically, step 103 in FIG. 1 for forming the first and second gate structures may include the following process(es):

In some embodiments, a gate insulating layer may be formed on an inner surface of the first shallow trench isolation trench, an inner surface of the second shallow trench isolation trench, and the substrate. A gate layer may be formed on the gate insulating layer. The gate insulating layer and the gate layer may be etched. The remaining gate insulating layer and the remaining gate layer may form the first and second gate structures.

Figure 2J:
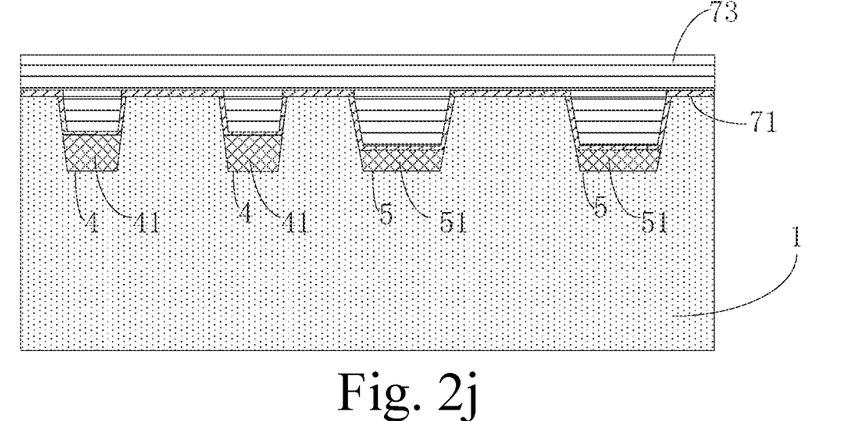
Figure 2K:
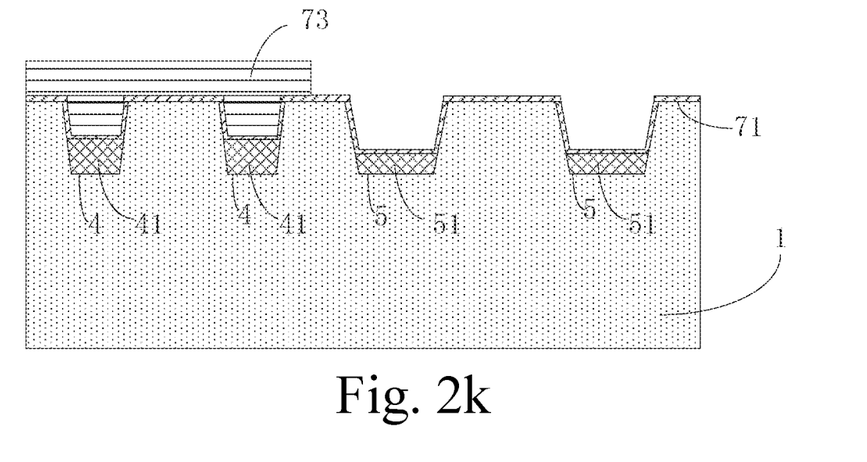
Figure 2L:
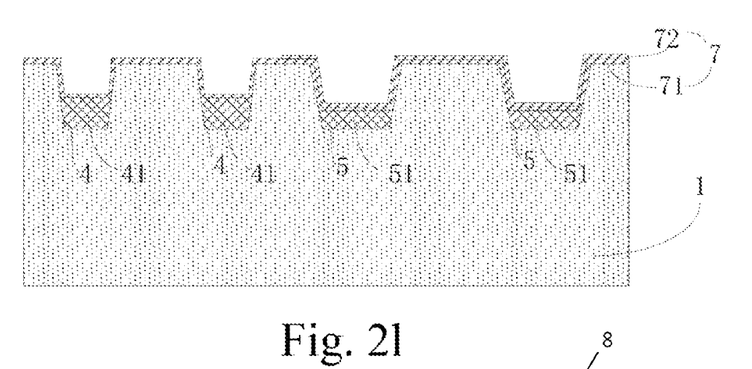

As shown in FIG. 2j, in some embodiments, a first gate insulating layer 71 may be formed on an inner surface of the first shallow trench isolation trench 4, an inner surface of the second shallow trench isolation trench 5, and the substrate 1 (including the first active area 2 and the second active area 3), and a sacrificial layer 73 may be formed on the first gate insulating layer 71 and may fill the first shallow trench isolation trench 4 and the second shallow trench isolation trench 5. As shown in FIG. 2k, in some embodiments, the sacrificial layer 73 may be etched to remove a portion of the sacrificial layer 73 on the second shallow trench isolation trench 5 and the second active area 3 to, i.e., expose the portion of the first gate insulating layer 71 on the second shallow trench isolation trench 5 and the second active area 3. Further, as shown in FIG. 2l, a second gate insulating layer 72 may be formed on the second shallow trench isolation trench 5 and the first gate insulating layer 71 over the second active area 3, and the rest (a remaining portion) of the sacrificial layer 73 (including the portion of the sacrificial layer 73 over the first shallow trench isolation trench 4 and the first active area 2) may be removed. The first gate insulating layer 71 and the second gate insulating layer 72 may form a gate insulating layer 7. In some instances, the portion of the gate insulating layer 7 over the second shallow trench isolation trench 5 and the second active area 3 may have a thickness larger than that of the portion of the gate insulating layer 7 over the first shallow trench isolation trench 4 and the first active area 2.

Figure 2M:
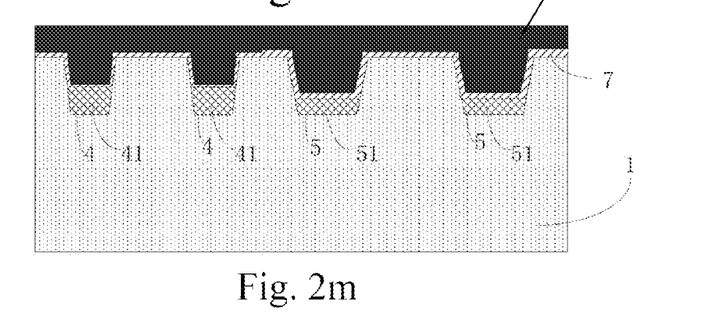
Figure 2N:
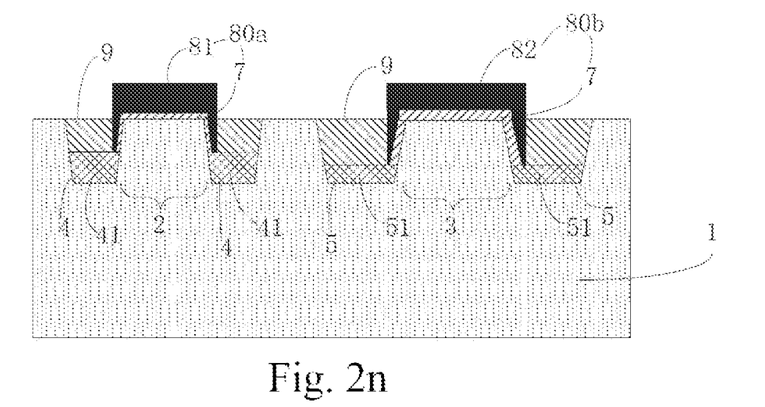

As shown in FIG. 2m, in some embodiments, a gate layer 8 may be formed on the gate insulating layer 7 (which may be a single-layer structure) and fill the first shallow trench isolation trench 4 and the second shallow trench isolation trench 5. Subsequently, as shown in FIG. 2n, the gate layer 8 may be etched to form a first gate 81 on the first active area 2 and a second gate 82 on the second active area 3. Referring to the illustration in FIG. 2h, the first gate 81 may be arranged between the first source region 21 and the first drain region 22 of the first active area 2 and extend along two opposite sidewalls of the first active area 2 to the first bottom isolation layer 41. Further, the second gate 82 may be arranged between the second source region 31 and the second drain region 32 of the second active area 3 and extend along two opposite sidewalls of the second active area 3 to the second bottom isolation layer 51.

In some embodiments, the gate insulating layer 7 may also be etched while etching the gate layer 8, to leave only the portions of the gate insulating layer 7 between the first gate 81 and the first active area 2 and between the second gate 82 and the second active area 3, through which the first gate may be isolated from the first active area 2 and the second gate 82 may be isolated from the second active area 3. The first gate 81 and the corresponding portion of the gate insulating layer 7 may form the first gate structure 80a, while the second gate 82 and the corresponding portion of the gate insulating layer 7 may form the second gate structure 80b.

Furthermore, after the step of forming the first and second gate structures, the method may also include the following process(es):

In some embodiments, an insulating layer may be filled into the first and second shallow trench isolation trenches, such that the portion of the insulating layer in the first shallow trench isolation trench and the first bottom isolation layer may form a first shallow trench isolation structure, and the portion of the insulating layer in the second shallow trench isolation trench and the second bottom isolation layer may form a second shallow trench isolation structure.

Figure 2O:
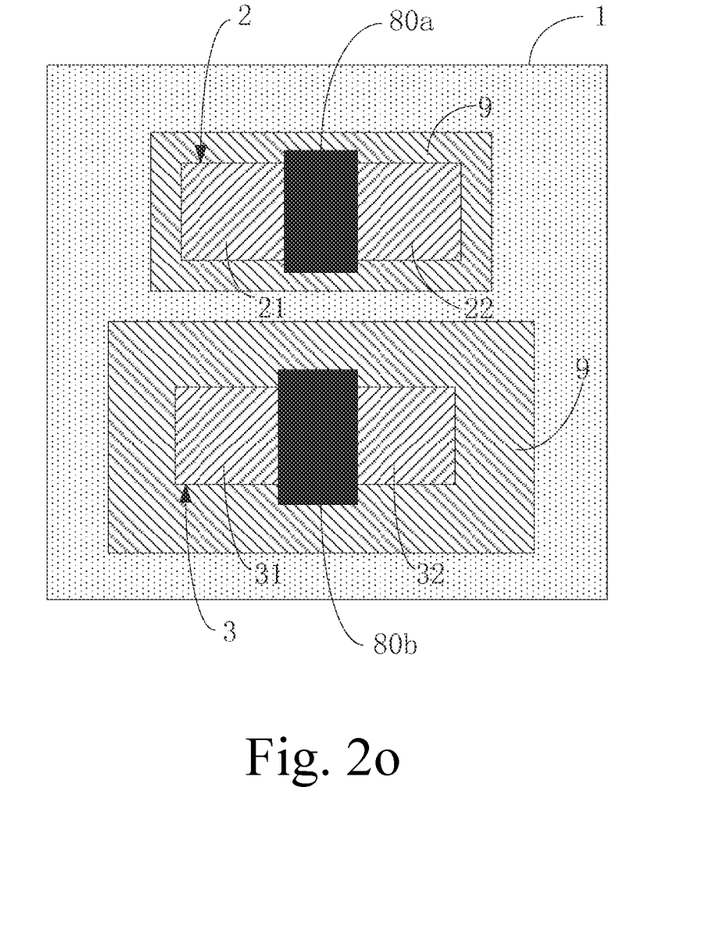

In some embodiments, after etching of the gate layer 8, the portions of the gate layer 8 in the first shallow trench isolation trench 4 and the second shallow trench isolation trench 5 may be partially etched and, as shown in FIG. 2o, an insulating layer 9 may be filled into the first shallow trench isolation trench 4 and the second shallow trench isolation trench 5. The insulating layer 9 in the first shallow trench isolation trench 4 may be arranged on the first bottom isolation layer 41, which may function as the first shallow trench isolation structure in combination with the first bottom isolation layer 41, to isolate the first transistor from other transistors. The insulating layer 9 in the second shallow trench isolation trench 5 may be arranged on the second bottom isolation layer 51, which may function as the second shallow trench isolation structure in combination with the second bottom isolation layer 51, to isolate the second transistor from other transistors.

According to the method of fabricating a semiconductor device provided by some embodiments of the present disclosure, the first and second shallow trench isolation trenches may be firstly formed in the substrate. The first and second bottom isolation layers may be formed in the first and second shallow trench isolation trenches respectively, where the thickness of the second bottom isolation layer may be less than that of the first bottom isolation layer. The first and second gate structures may be formed, such that the first gate structure may be arranged on the first active area and extend along two opposite sidewalls of the first active area to the first bottom isolation layer. Further, the second gate structure may be arranged on the second active area and extend along two opposite sidewalls of the second active area to the second bottom isolation layer. The extending distances of the first and second gate structures along the sidewalls of their corresponding active areas may be different from each other, at least due to the different thicknesses of the bottom isolation layers, so that transistors with different junction depths may be obtained and the footprint of the semiconductor device may be reduced.

Figure 3:
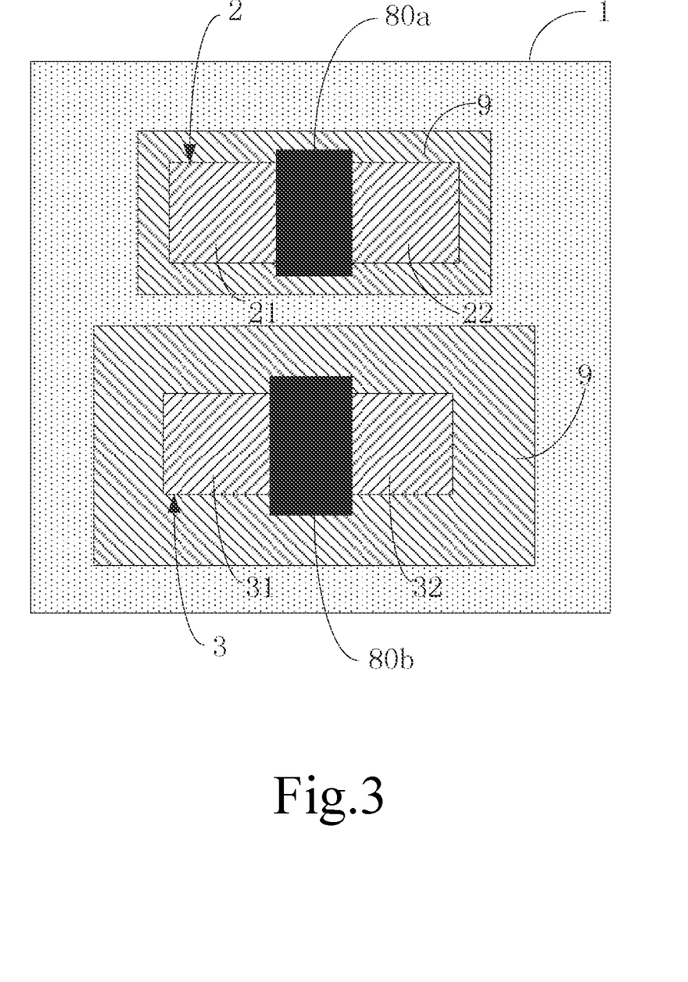
FIG. 3 is a structural diagram of an exemplary semiconductor device, according to some embodiments of the present disclosure.
Figure 4:
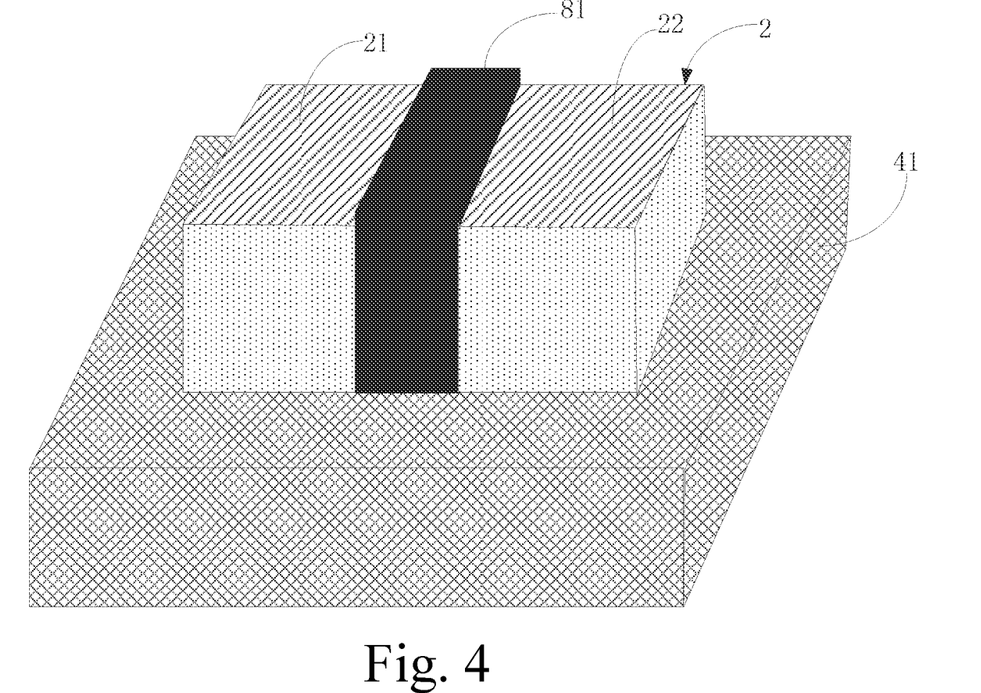
FIG. 4 is a structural diagram of a first transistor of an exemplary semiconductor device, according to some embodiments of the present disclosure.
Figure 5:
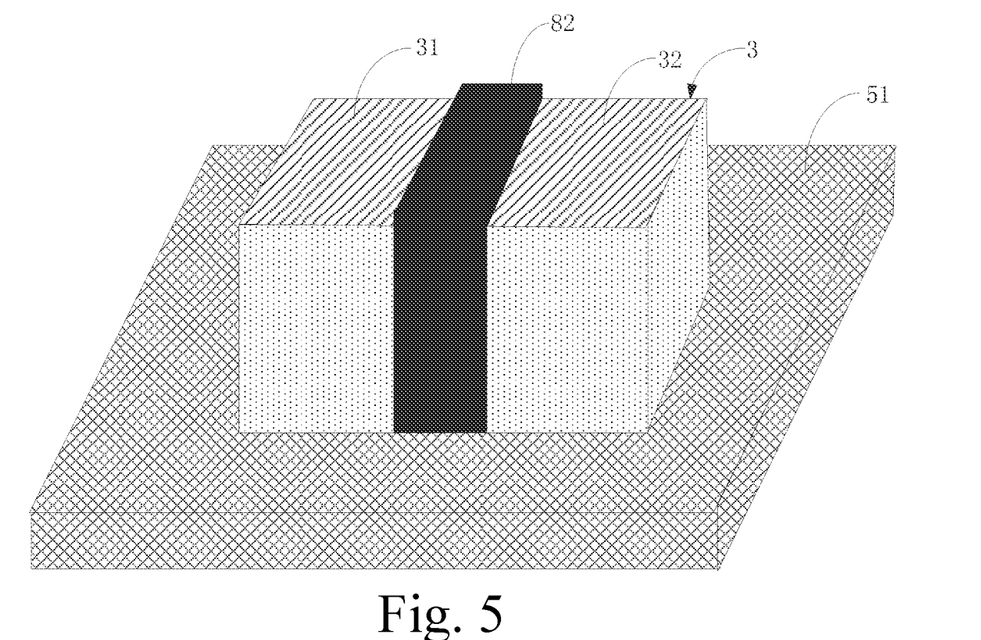
FIG. 5 is a structural diagram of a second transistor of another exemplary semiconductor device, according to some embodiments of the present disclosure.

Referring to FIG. 3 in combination with FIGS. 4 and 5, the present disclosure provides some embodiments of a semiconductor device. As shown in FIGS. 3-5, the semiconductor device may include a substrate 1, a first bottom isolation layer 41, a second bottom isolation layer 51, a first gate structure 80a, and a second gate structure 80b.

In some embodiments, the substrate 1 may include the first active area 2 and the second active area 3 disposed separately from each other. The first active area 2 may include the first source region 21 and the first drain region 22 disposed separately from each other, and the second active area 3 may include a second source region 31 and a second drain region 32 disposed separately from each other.

Referring to FIG. 4, in some embodiments, the first bottom isolation layer 41 may be arranged on the periphery of the bottom of the first active area 2 (omitting the display of the insulating layer 9). The first bottom isolation layer 41 may surround the bottom of the first active area 2. As shown in FIG. 5, the second bottom isolation layer 51 may be arranged on the periphery of the bottom of the second active area 3 (omitting the display of the insulating layer 9). The second bottom isolation layer 51 may surround the bottom of the second active area 3. The thickness of the second bottom isolation layer 51 may be less than that of the first bottom isolation layer 41.

In some embodiments, the first gate structure 80a may be arranged on a portion of the first active area 2 between the first source region 21 and the first drain region 22 and extend along two opposite sidewalls of the first active area 2 onto the first bottom isolation layer 41. The second gate structure 80b may be on the second active area 3 between the second source region 31 and the second drain region 32 and extend along two opposite sidewalls of the second active area 3 onto the second bottom isolation layer 51.

The first source region 21 and the first drain region 22 in the first active area 2 as well as the first gate structure 80a may form a first transistor, while the second source region 31 and the second drain region 32 in the second active area 3 as well as the second gate structure 80b may form a second transistor. The first gate structure 80a in the first transistor may be arranged on the first active area 2 and extend along two opposite sidewalls of the first active area 2 to reduce the footprint of the first transistor, and the second gate structure 80b in the second transistor may be arranged on the second active area 3 and extend along two opposite sidewalls of the second active area 3 to reduce the footprint of the second transistor, thus further reducing the footprint of the semiconductor device. Moreover, the depth of the first gate structure 80a extending along the sidewalls of the first active area 2 may be different from the depth of the second gate structure 80b extending along the sidewalls of the second active area 3, so that the first and second transistors may include transistors with different junction depths.

The first active area 2 may be a low-voltage active area, i.e. the first transistor may be a low-voltage transistor; and the second active area 3 may be a high-voltage active area, i.e. the second transistor may be a high-voltage transistor. The terms "high-voltage" and "low-voltage" are relative concepts, and a high-voltage transistor may operate at a voltage higher than a low-voltage transistor.

Furthermore, the cross-sectional area of the second bottom isolation layer 51 may be larger than the cross-sectional area of the first bottom isolation layer 41, taken along the sectional line A shown in FIG. 2a.

Furthermore, the etching rate of the first bottom isolation layer 41 may be slower than that of the second bottom isolation layer 51.

Furthermore, each of the first gate structure 80a and the second gate structure 80b may include a gate insulating layer 7 on the corresponding active area and a gate layer on the gate insulating layer. The gate layer may include the first gate 81 and the second gate 82. The first gate structure 80a may include the first gate 81 and the gate insulating layer corresponding to the first gate 81, and the second gate structure 80b may include the second gate 82 and the gate insulating layer corresponding to the second gate 82. The gate insulating layer corresponding to the first gate 81 may include a thickness less than the thickness of the gate insulating layer corresponding to the second gate 82. The gate insulating layer corresponding to the first gate 81 may be configured to isolate the first gate 81 from the first active area 2, and the gate insulating layer corresponding to the second gate 82 may be configured to isolate the second gate 82 from the second active area 3.

The insulating layer 9 may be disposed on the first bottom isolation layer 41 and the second bottom isolation layer 51. The first bottom isolation layer 41 and the insulating layer 9 corresponding to the first bottom isolation layer 41 may form the first shallow trench isolation structure, and the second bottom isolation layer 51 and the insulating layer 9 corresponding to the second bottom isolation layer 51 may form the second shallow trench isolation structure.

The first shallow trench isolation structure may be configured to isolate the first transistor from other transistors, and the second shallow trench isolation structure may be configured to isolate the second transistor from other transistors.

According to the semiconductor device provided by the embodiment of the present disclosure, the first gate structure is on the first active area and extends along two opposite sidewalls of the first active area to the first bottom isolation layer, the second gate structure is on the second active area and extends along two opposite sidewalls of the second active area to the second bottom isolation layer, and the thickness of the second bottom isolation layer is less than that of the first bottom isolation layer, so that the extending distances of the first and second gate structures along the sidewalls of their corresponding active areas are different from each other in order to obtain transistors with different junction depths and reduce the footprint of the semiconductor device.

In summary, the present disclosure has been disclosed above with reference to some embodiments; however, the embodiments above are not used to limit the disclosure. On the contrary, variations and modifications may be made by those of ordinary skills in the art without departing from the spirit and scope of the present disclosure, which has a scope only defined by the following claims.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The Summary and Abstract sections may set forth one or more but not all exemplary embodiments of the present disclosure as contemplated by the inventor(s), and thus, are not intended to limit the present disclosure and the appended claims in any way.

Various embodiments are disclosed above. The particular arrangements provided are illustrative and without limitation. Accordingly, certain steps, functions, and/or configurations may be re-ordered or combined in diverse ways than in the examples provided above. Likewise, certain embodiments that include only a subset of the steps, functions, and configurations may be permitted.

The breadth and scope of the present disclosure should not be limited by any of the above-described exemplary embodiments but should be defined only in accordance with the following claims and their equivalents.

What is claimed is:

1. A semiconductor device, comprising:
   a first shallow trench isolation trench corresponding to a first transistor and a second shallow trench isolation trench corresponding to a second transistor; and
   a first bottom isolation layer into the first shallow trench isolation trench and a second bottom isolation layer into the second shallow trench isolation trench, a thickness of the second bottom isolation layer being less than a thickness of the first bottom isolation layer,
   wherein:
   a first gate structure, corresponding to the first transistor, extends onto the first bottom isolation layer to have a first junction depth, and a second gate structure, corresponding to the second transistor, extends onto the second bottom isolation layer to have a second junction depth, the first junction depth being different from the second junction depth; and
   the first bottom isolation layer and the second bottom isolation layer, in a location between the first gate structure and the second gate structure, are discontinuous.

2. The semiconductor device of claim 1, a size of an opening of the second shallow trench isolation trench is larger than a size of an opening of the first shallow trench isolation trench.

3. The semiconductor device of claim 1, wherein:
   the first gate structure comprises a first gate insulating layer on inner surfaces of the first shallow trench isolation trench and a first gate layer on the first gate insulating layer, the first gate insulating layer being arranged between a substrate and the first gate layer; and
   the second gate structure comprises a second gate insulating layer on inner surfaces of the second shallow trench isolation trench and a second gate layer on the second gate insulating layer, the second gate insulating layer being arranged between the substrate and the second gate layer.

4. The semiconductor device of claim 3, wherein a thickness of the second gate insulating layer is larger than a thickness of the first gate insulating layer.

5. The semiconductor device of claim 3, wherein:
the first transistor comprises a first insulating layer on the first bottom isolation layer in the first shallow trench isolation trench; and
the second transistor comprises a second insulating layer on the second bottom isolation layer in the second shallow trench isolation trench.

6. The semiconductor device of claim 3, wherein the first transistor comprises a first active area corresponding to a low-voltage active area, and the second transistor comprises a second active area corresponding to a high-voltage active area.

7. The semiconductor device of claim 1, wherein:
the first gate structure comprises a first gate insulating layer arranged on inner sidewalls of the first shallow trench isolation trench; and
the second gate structure comprises a second gate insulating layer arranged on inner sidewalls of the second shallow trench isolation trench.

8. The semiconductor device of claim 7, wherein:
the second gate insulating layer on the inner sidewalls of the second shallow trench isolation trench has a thickness larger than a thickness of the first gate insulating layer.

9. The semiconductor device of claim 7, wherein:
the second gate structure comprises a second gate layer arranged over the inner sidewalls of the second shallow trench isolation trench.

10. The semiconductor device of claim 1, wherein:
a same insulating material is arranged on the first bottom isolation layer in the first shallow trench isolation trench and on the second bottom isolation layer in the second shallow trench isolation trench.

11. The semiconductor device of claim 10, wherein:
the first gate structure is embedded in the insulating material to be in direct contact with the first bottom isolation layer; and
the second gate structure is embedded in the insulating material to be in direct contact with the second bottom isolation layer.

12. The semiconductor device of claim 1, wherein:
the first gate structure comprises a first gate layer, and the second gate structure comprises a second gate layer, the first gate layer and the second gate layer being discontinuous.

13. A semiconductor device, comprising:
a first shallow trench isolation trench and a second shallow trench isolation trench;
a first bottom isolation layer into the first shallow trench isolation trench and a second bottom isolation layer into the second shallow trench isolation trench; and
a first gate structure arranged onto inner sidewalls of the first shallow trench isolation trench to have a first junction in direct contact with the first bottom isolation layer, and a second gate structure arranged onto inner sidewalls of the second shallow trench isolation trench to have a second junction in direct contact with the second bottom isolation layer,
wherein:
a thickness of the first bottom isolation layer is larger than a thickness of the second bottom isolation layer; and
a depth of the first junction is smaller than a depth of the second junction.

14. The semiconductor device of claim 13, wherein:
the first gate structure comprises a first gate layer, and the second gate structure comprises a second gate layer, the first gate layer and the second gate layer being discontinuous.

15. The semiconductor device of claim 13, wherein:
the first gate structure comprises a first gate insulating layer onto the inner sidewalls of the first shallow trench isolation trench, and the second gate structure comprises a second gate insulating layer onto the inner sidewalls of the second shallow trench isolation trench.

16. The semiconductor device of claim 15, wherein:
the second gate insulating layer arranged on the inner sidewalls of the second shallow trench isolation trench has a thickness larger than a thickness of the first gate insulating layer.

17. The semiconductor device of claim 13, wherein:
a same insulating material is arranged on the first bottom isolation layer in the first shallow trench isolation trench and the second bottom isolation layer in the second shallow trench isolation trench.

18. The semiconductor device of claim 17, wherein:
the first gate structure and the second gate structure are embedded in the insulating material to have direct contact with the first bottom isolation layer and the second bottom isolation layer, respectively.

19. The semiconductor device of claim 17, wherein:
a thickness of the insulating material in the first shallow trench isolation trench is less than a thickness of the insulating material in the second shallow trench isolation trench.

20. The semiconductor device of claim 13, wherein:
the first bottom isolation layer and the second bottom isolation layer, in a location between the first gate structure and the second gate structure, are discontinuous.

* * * * *